(12) United States Patent
Utsunomiya

(10) Patent No.: US 7,902,895 B2
(45) Date of Patent: Mar. 8, 2011

(54) SEMICONDUCTOR DEVICE EQUIPPED WITH A PULL-DOWN CIRCUIT

(75) Inventor: Fumiyasu Utsunomiya, Chiba (JP)

(73) Assignee: Seiko Instruments Inc., Chiba (JP)

( * ) Notice: Subject to any disclaimer, the term of this patent is extended or adjusted under 35 U.S.C. 154(b) by 212 days.

(21) Appl. No.: 12/365,503

(22) Filed: Feb. 4, 2009

(65) Prior Publication Data

US 2009/0195284 A1    Aug. 6, 2009

(30) Foreign Application Priority Data

Feb. 5, 2008    (JP) .................................. 2008-025016

(51) Int. Cl.
*H03K 3/037*    (2006.01)
(52) U.S. Cl. ........................................ 327/217; 327/427
(58) Field of Classification Search ................. 327/217, 327/427, 436, 437, 112
See application file for complete search history.

(56) References Cited

U.S. PATENT DOCUMENTS

| 6,091,264 | A  | * | 7/2000  | Kirsch et al. ................... 326/70 |
| 6,714,053 | B2 | * | 3/2004  | Mohan ............................ 327/65 |
| 6,882,203 | B2 | * | 4/2005  | Miyagi .......................... 327/217 |
| 2003/0214337 | A1 | | 11/2003 | Miyagi |

FOREIGN PATENT DOCUMENTS

JP          2003-332892 A    11/2003

* cited by examiner

*Primary Examiner* — Hai L Nguyen
(74) *Attorney, Agent, or Firm* — Brinks Hofer Gilson & Lione

(57) ABSTRACT

Provided is a semiconductor device equipped with a pull-down circuit capable of reducing its area. The pull-down circuit is formed of a depletion type NMOS transistor in which a gate thereof is connected to a ground potential, and an enhancement type NMOS transistor in which a gate and a drain thereof are connected to a source of the depletion type NMOS transistor and a source thereof is connected to the ground potential. An overdrive voltage of the depletion type NMOS transistor is reduced by a threshold voltage of the enhancement type NMOS transistor, whereby a size of the depletion type NMOS transistor can be reduced. Accordingly, an area of the pull-down circuit can be reduced.

16 Claims, 2 Drawing Sheets

SEMICONDUCTOR DEVICE EQUIPPED WITH A PULL-DOWN CIRCUIT

RELATED APPLICATIONS

This application claims priority under 35 U.S.C. §119 to Japanese Patent Application No. JP2008-025016 filed on Feb. 5, 2008, the entire content of which is hereby incorporated by reference.

BACKGROUND OF THE INVENTION

1. Field of the Invention

The present invention relates to a semiconductor device equipped with a pull-down circuit for fixing a predetermined terminal of a predetermined circuit to low when power is turned on and when a power supply voltage decreases.

2. Description of the Related Art

In a semiconductor device, in some cases, a pull-down circuit is provided to an internal node which needs to be fixed to low so as to prevent malfunction thereof when power is turned on and when a power supply voltage decreases, whereby the pull-down circuit fixes the internal node to low when the power is turned on and when the power supply voltage decreases.

A semiconductor device equipped with a conventional pull-down circuit is described. FIG. 2 is a schematic circuit diagram of a semiconductor device equipped with a conventional pull-down circuit.

A pull-down circuit 40 includes a depletion type NMOS transistor 41. The pull-down circuit 40 includes a terminal 42. In the depletion type NMOS transistor 41, a gate and a source thereof are connected to a ground terminal, and a drain thereof is connected to a pull-down node 31 through the terminal 42. Moreover, in order to prevent that a voltage of the pull-down node 31 increases precipitously to momentarily become high due to power-on and decrease in power supply voltage of a latch circuit 20, there is also generally provided a capacitor (not shown) between the pull-down node 31 and the ground terminal.

Here, the pull-down circuit 40 fixes the pull-down node 31 (terminal 24 of the latch circuit 20) to low when the power is turned on and when the power supply voltage decreases. Further, the depletion type NMOS transistor 41 has a characteristic that the gate and the source thereof are connected to the ground terminal to make a drain current a constant current, and is used also as a constant-current circuit. Depending on variation and a temperature characteristic of the constant current, the circuit design is made so that a threshold voltage of the depletion type NMOS transistor 41 is set to about −0.5 V to −0.4 V (for example, see JP 2003-332892 A).

Further, in place of the depletion type NMOS transistor 41, a high-resistance element (not shown) is provided as the pull-down circuit 40 between the pull-down node 31 (terminal 42) and the ground terminal in some cases.

However, when it is structured to reduce a consumption current of the depletion type NMOS transistor 41, a resistance value of an on-resistance of the depletion type NMOS transistor 41 increases, thereby increasing an L length of the depletion type NMOS transistor 41. As a result, an area of the pull-down circuit 40 including the depletion type NMOS transistor 41 increases, and correspondingly, an area of the semiconductor device increases as well.

Alternatively, when the high-resistance element is used in place of the depletion type NMOS transistor 41 so as to reduce the consumption current of the high-resistance element, a resistance value of the high-resistance element becomes larger, thereby increasing a length of the high-resistance element. Accordingly, the area of the pull-down circuit 40 including the high-resistance element increases, and correspondingly, the area of the semiconductor device increases as well.

SUMMARY OF THE INVENTION

The present invention has been made in view of the above-mentioned problem, and therefore an object thereof is to provide a semiconductor device equipped with a pull-down circuit capable of reducing an area thereof.

In order to solve the above-mentioned problem, the present invention provides a semiconductor device equipped with a pull-down circuit which fixes a predetermined terminal of a predetermined circuit to low when power is turned on and when a power supply voltage decreases, the pull-down circuit including: a depletion type NMOS transistor in which a gate thereof is applied with a ground voltage; and an enhancement type NMOS transistor in which a gate thereof is applied with a voltage based on a source voltage of the depletion type NMOS transistor, the pull-down circuit feeding, when the power is turned on and when the power supply voltage decreases, a current through a path extending from the predetermined terminal to a ground terminal via a channel of the depletion type NMOS transistor and a channel of the enhancement type NMOS transistor sequentially to fix the predetermined terminal to low.

According to the pull-down circuit of the present invention, an overdrive voltage of the depletion type NMOS transistor is reduced by a threshold voltage of the enhancement type NMOS transistor, with the result that a size of the depletion type NMOS transistor can be reduced. Accordingly, an area of the pull-down circuit can be reduced.

DETAILED DESCRIPTION OF THE PREFERRED EMBODIMENT

Hereinafter, an embodiment of the present invention is described with reference to the drawings.

Figure 1:
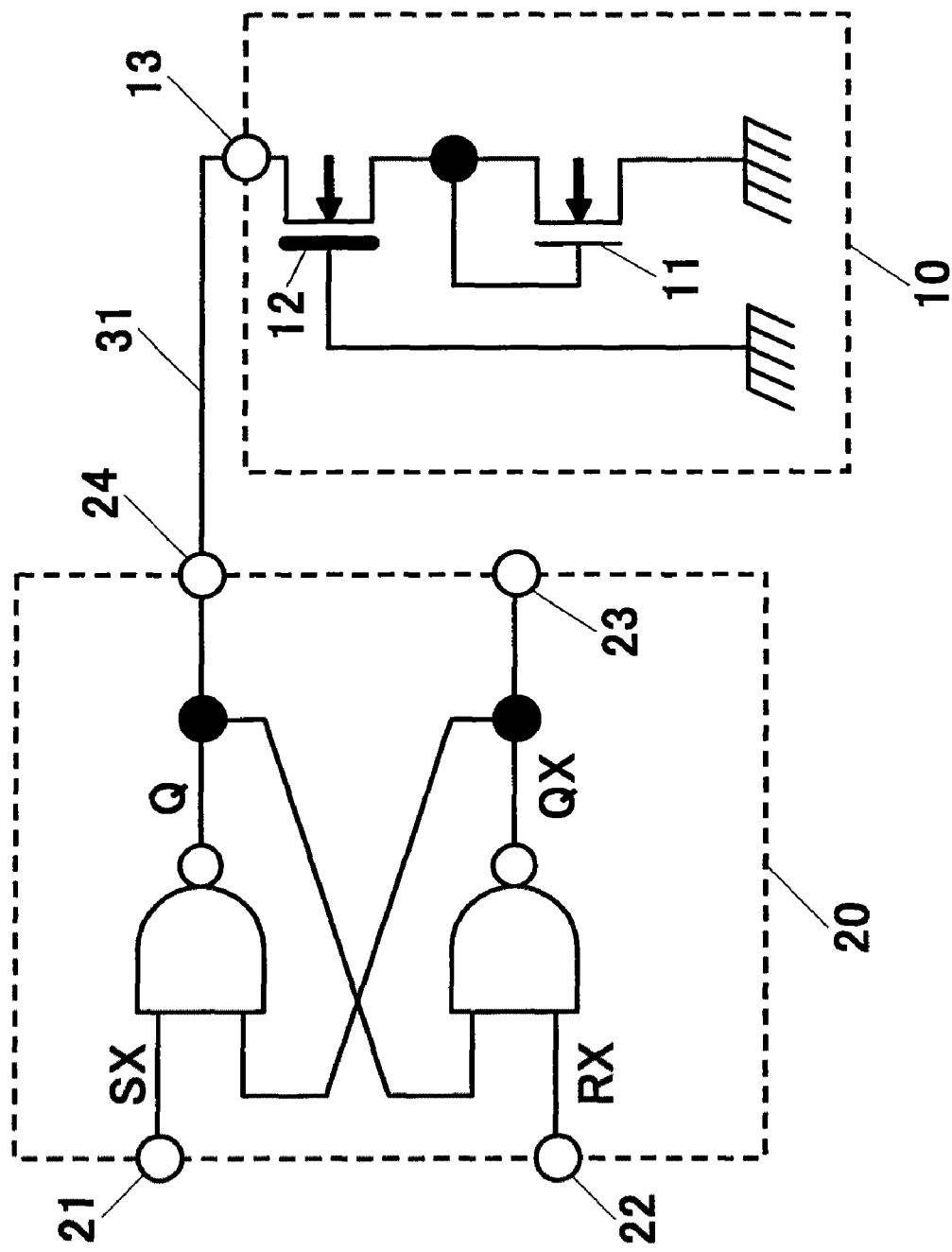
FIG. 1 is a schematic circuit diagram of a semiconductor device equipped with a pull-down circuit.
Figure 2:
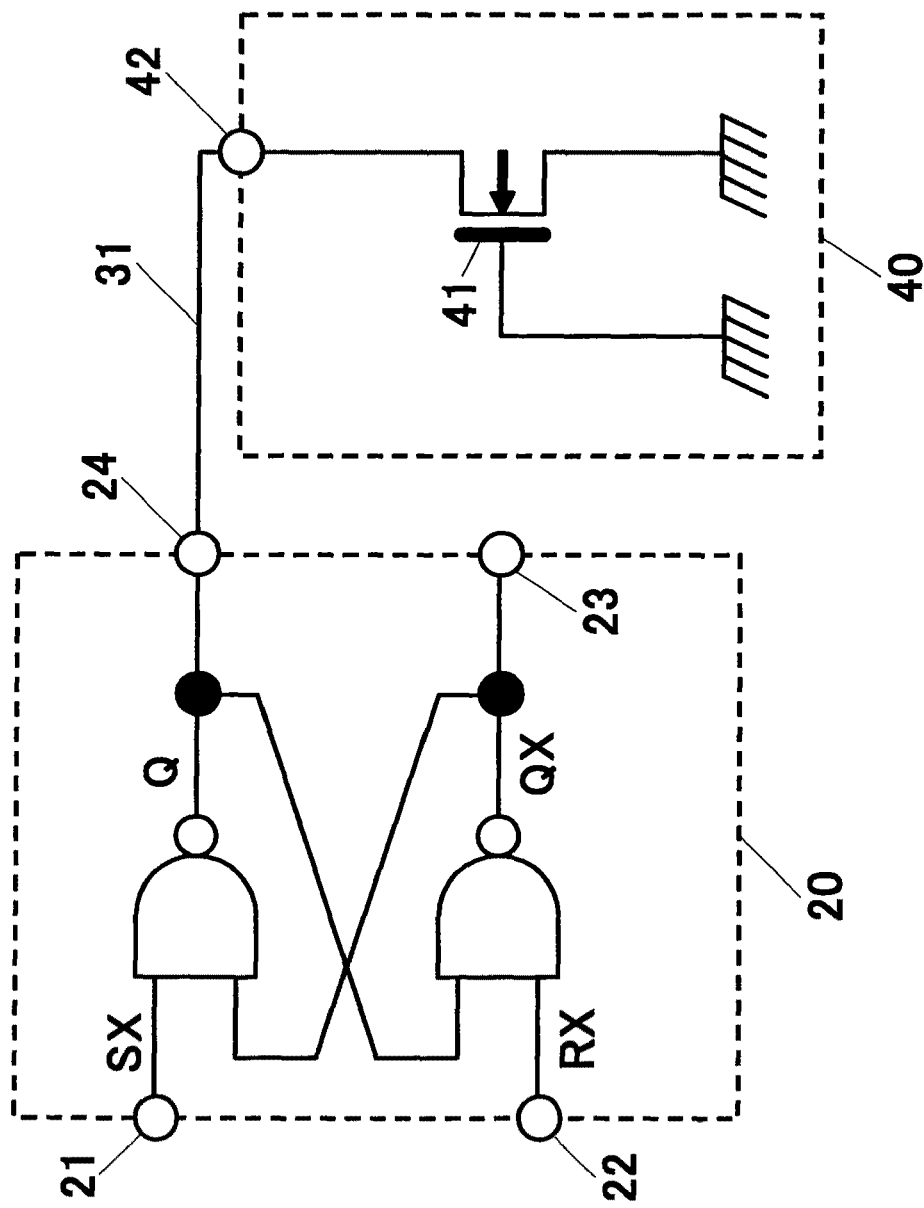
FIG. 2 is a schematic circuit diagram of a semiconductor device equipped with a conventional pull-down circuit.

First, a structure of a semiconductor device equipped with a pull-down circuit is described. FIG. 1 is a schematic circuit diagram of the semiconductor device equipped with the pull-down circuit.

The semiconductor device includes a latch circuit 20 and a pull-down circuit 10. The pull-down circuit 10 includes a depletion type NMOS transistor 12 and an enhancement type NMOS transistor 11. The latch circuit 20 includes terminals 21 to 24. The pull-down circuit 10 includes a terminal 13. In the latch circuit 20, the terminal 24 is connected to a pull-down node 31 (node of the terminal 24 of the latch circuit 20). In the depletion type NMOS transistor 12, a gate thereof is connected to a ground terminal, a source thereof is connected to a gate and a drain of the enhancement type NMOS transistor 11, and a drain thereof is connected to the pull-down node 31 through the terminal 13. In the enhancement type NMOS transistor 11, a source thereof is connected to the ground terminal.

Here, the latch circuit 20 is taken as an example of a circuit, and includes the pull-down node 31 which needs to be fixed to low to prevent malfunction thereof when power is turned on and when a power supply voltage decreases. The pull-down circuit 10 fixes the pull-down node 31 to low when the power is turned on and when the power supply voltage decreases. The depletion type NMOS transistor 12 has an absolute value of a threshold voltage, which is higher compared with the enhancement type NMOS transistor 11. Further, the depletion type NMOS transistor 12 has driving performance which is higher compared with the enhancement type NMOS transistor 11. Then, a resistance between the pull-down node 31 and the drain of the enhancement type NMOS transistor 11 is reduced, and correspondingly, an effect of a gate capacitance of the enhancement type NMOS transistor 11 with respect to the pull-down node 31 increases. The gate capacitance of the enhancement type NMOS transistor 11 functions in order to prevent that a voltage of the pull-down node 31 increases precipitously to become momentarily high when the power is turned on and when the power supply voltage decreases in the latch circuit 20.

Next, an operation of the semiconductor device is described.

When the power is turned on, the voltage of the pull-down node 31 increases precipitously in some cases. Further, in other cases, when the power supply voltage decreases, an operation of the latch circuit 20 becomes unstable, whereby the voltage of the pull-down node 31 becomes unstable to become high. Then, a gate voltage and a drain voltage of the enhancement type NMOS transistor 11 increase precipitously, and when a voltage between the gate and the source of the enhancement type NMOS transistor 11 becomes equal to or larger than the threshold voltage of the enhancement type NMOS transistor 11, the enhancement type NMOS transistor 11 is turned on. The enhancement type NMOS transistor 11 is turned on while the depletion type NMOS transistor 12 is turned on, and hence a pull-down current flows through a pull-down path extending from the pull-down node 31 to the ground terminal via channels of the depletion type NMOS transistor 12 and the enhancement type NMOS transistor 11 sequentially. Accordingly, the pull-down node 31 is fixed to low.

Next, specific examples of the depletion type NMOS transistor 12 and the enhancement type NMOS transistor 11 are described.

Here, it is assumed that threshold voltages of a conventional depletion type NMOS transistor 41 and the depletion type NMOS transistor 12 are −0.4 V, and that a threshold voltage of the enhancement type NMOS transistor 11 is 0.2 V.

In this case, in the conventional pull-down circuit 40 including only the depletion type NMOS transistor 41, a value (value of an overdrive voltage) obtained by subtracting the threshold voltage (−0.4 V) from a gate voltage (0 V) of the depletion type NMOS transistor 41 is 0.4 V, and when a W length and an L length of the depletion type NMOS transistor 41 are 2 μm and 100 μm, respectively, a desired pull-down current flows.

On the other hand, in the pull-down circuit 10 formed of the depletion type NMOS transistor 12 and the enhancement type NMOS transistor 11, when the W length and the L length of the depletion type NMOS transistor 12 are about 5 μm and about 1 μm, respectively, the depletion type NMOS transistor 12 can supply a voltage of about 0.4 V to the gate and the drain of the enhancement type NMOS transistor 11. Then, a value (value of the overdrive voltage) obtained by subtracting the threshold voltage (0.2 V) from the gate voltage (0.4 V) of the enhancement type NMOS transistor 11 is 0.2 V, and when a W length and an L length of the enhancement type NMOS transistor 11 are 2 μm and about 50 μm, respectively, a desired pull-down current flows.

As described above, the W length and the L length of the depletion type NMOS transistor 12 are about 5 μm and about 1 μm, respectively, and therefore an area of the depletion type NMOS transistor 12 of the semiconductor device is small. In addition, the L length of the enhancement type NMOS transistor 11 is about 50 μm and an L length of the conventional depletion type NMOS transistor 41 is 100 μm, and thus the enhancement type NMOS transistor 11 has about a half area of the conventional depletion type NMOS transistor 41.

As a result, the overdrive voltage of the enhancement type NMOS transistor 11 is reduced, and correspondingly, the circuit design is made so that the enhancement type NMOS transistor 11 has high driving performance. The L length of the enhancement type NMOS transistor 11 is reduced, and hence a total area of the depletion type NMOS transistor 12 and the enhancement type NMOS transistor 11 of the pull-down circuit 10 becomes smaller than the area of the conventional pull-down circuit 40 formed of only the depletion type NMOS transistor 41. Accordingly, the area of the semiconductor device is reduced correspondingly.

Further, in the conventional pull-down circuit 40 formed of only the depletion type NMOS transistor 41 or the conventional pull-down circuit formed of only the high-resistance element, a capacitor is also provided between the pull-down node and the ground terminal to prevent that the voltage of the pull-down node increases precipitously to momentarily become high due to power-on and a decrease in power supply voltage of the latch circuit. As a result, the area of the pull-down circuit increases by an area of the capacitor, whereby the area of the semiconductor device increases as well. However, in the pull-down circuit 10 formed of the depletion type NMOS transistor 12 and the enhancement type NMOS transistor 11, the gate capacitance of the enhancement type NMOS transistor 11 exists as a parasitic capacitance between the pull-down node 31 and the ground terminal, and thus there is no need to provide the capacitor between the pull-down node 31 and the ground terminal. Accordingly, the area of the pull-down circuit 10 does not increase correspondingly, and hence the area of the semiconductor device does not increase as well.

Further, the high-resistance element has variability in resistance value and is used in various circuits of the semiconductor device, and therefore is made so as to have a low sheet resistance value. As a result, when a consumption current of the high-resistance element is made small in the conventional pull-down circuit formed of only the high-resistance element, a resistance value of the high-resistance element increases, and a length thereof is increased due to a low sheet resistance value. Therefore, the area of the pull-down circuit including the high-resistance element increases, and correspondingly, the area of the semiconductor device increases as well. However, the high-resistance element is not used in the pull-down circuit 10 formed of the depletion type NMOS transistor 12 and the enhancement type NMOS transistor 11, and hence, as described above, the area of the pull-down circuit 10 is reduced, and the area of the semiconductor device is reduced as well.

It should be noted that a resistance element (not shown) or an element (not shown) which functions like a resistance element may be provided in the path of the current flowing from the pull-down node 31 to the ground terminal through the pull-down circuit 10, with the result that the area of the pull-down circuit 10 is reduced, to thereby reduce the area of the semiconductor device as well.

The invention claimed is:

1. A semiconductor device comprising:
   an internal node; and
   a pull-down circuit connected to the internal node for fixing the internal node to low when a power signal is activated or a power supply voltage decreases, the pull-down circuit comprising:
   an input terminal connected to the internal node;
   a depletion type NMOS transistor connected to the input terminal; and
   an enhancement type NMOS transistor comprising a gate and a drain connected to a source of the depletion type NMOS transistor, where an absolute value of a threshold voltage of the depletion type NMOS transistor is greater than an absolute value of a threshold voltage of the enhancement type NMOS transistor.

2. The semiconductor device of claim 1, the depletion type NMOS transistor comprising:
   a drain connected to the input terminal; and
   a gate connected to a ground terminal.

3. The semiconductor device of claim 1, the enhancement type NMOS transistor comprising a source connected to a ground terminal.

4. The semiconductor device of claim 1, where the depletion type NMOS transistor is configured to have a greater driving performance than the enhancement type NMOS transistor.

5. The semiconductor device of claim 1, the depletion type NMOS transistor comprising a width of approximately 5 μm and a length of approximately 1 μm.

6. The semiconductor device of claim 1, the enhancement type NMOS transistor comprising a width of approximately 2 μm and a length of approximately 50 μm.

7. A semiconductor device comprising:
   an internal node; and
   a pull-down circuit connected to the internal node for fixing the internal node to low when a power signal is activated or a power supply voltage decreases, the pull-down circuit comprising:
   a depletion type NMOS transistor comprising:
      a drain connected to an internal node of the semiconductor device;
      a gate connected to a ground terminal; and
      a source; and
   an enhancement type NMOS transistor comprising:
      a gate and a drain connected to the source of the depletion type NMOS transistor; and
      a source connected to the ground terminal.

8. The semiconductor device of claim 7, where an absolute value of a threshold voltage of the depletion type NMOS transistor is greater than an absolute value of a threshold voltage of the enhancement type NMOS transistor.

9. The semiconductor device of claim 7, the depletion type NMOS transistor comprising a width of approximately 5 μm and a length of approximately 1 μm.

10. The semiconductor device of claim 7, the enhancement type NMOS transistor comprising a width of approximately 2 μm and a length of approximately 50 μm.

11. A semiconductor device comprising:
    an internal node; and
    a pull-down circuit connected to the internal node for fixing the internal node to low when a power signal is activated or a power supply voltage decreases, the pull-down circuit comprising:
    a depletion type NMOS transistor connected to an internal node of the semiconductor device; and
    an enhancement type NMOS transistor comprising a gate and a drain connected to a source of the depletion type NMOS transistor.

12. The semiconductor device of claim 11, the depletion type NMOS transistor comprising:
    a drain connected to the internal node; and
    a gate connected to a ground terminal.

13. The semiconductor device of claim 11, the enhancement type NMOS transistor comprising a source connected to a ground terminal.

14. The semiconductor device of claim 11, where the depletion type NMOS transistor is configured to have a greater driving performance than the enhancement type NMOS transistor.

15. The semiconductor device of claim 11, the depletion type NMOS transistor comprising a width of approximately 5 μm and a length of approximately 1 μm.

16. The semiconductor device of claim 11, the enhancement type NMOS transistor comprising a width of approximately 2 μm and a length of approximately 50 μm.

* * * * *